United States Patent
Vollrath et al.

(10) Patent No.: US 6,490,209 B1
(45) Date of Patent: Dec. 3, 2002

(54) MEMORY EMPLOYING MULTIPLE ENABLE/DISABLE MODES FOR REDUNDANT ELEMENTS AND TESTING METHOD USING SAME

(75) Inventors: Joerg Vollrath, Richmond, VA (US); Randall Rooney, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/968,749

(22) Filed: Oct. 2, 2001

(51) Int. Cl.[7] .................................................. G11C 7/00
(52) U.S. Cl. ..................................... 365/200; 365/225.7
(58) Field of Search .............................. 365/200, 225.7, 365/230.06

(56) References Cited

U.S. PATENT DOCUMENTS

| | | | |
|---|---|---|---|
| 5,652,725 A | * 7/1997 | Suma et al. ................. | 365/200 |
| 5,666,312 A | 9/1997 | Robertson ............... | 365/189.02 |
| 5,831,917 A | 11/1998 | Vollrath ....................... | 365/200 |
| 6,141,267 A | * 10/2000 | Kirihata et al. ............. | 365/200 |

* cited by examiner

*Primary Examiner*—Son Mai
(74) *Attorney, Agent, or Firm*—Lerner, David, Littenberg, Krumholz & Mentlik, LLP (57) ABSTRACT

A memory includes a memory array having a plurality of storage elements; a plurality of replacement storage elements; a plurality of address storage units, each operable to store a replacement address associated with a respective one of the replacement storage elements; a plurality of enable storage units, each operable to store at least first and second enable bits associated with a respective one of the replacement storage elements; and a decode unit operable to (i) activate one of the replacement storage elements when the at least first and second enable bits associated therewith are in an enable state and an input address matches the replacement address associated with the replacement storage element, and (ii) deactivate the replacement storage element when the at least first and second enable bits associated therewith have changed to a disable state.

12 Claims, 5 Drawing Sheets

FIG. 1

| ENABLE STORAGE UNITS | ADDRESS STORAGE UNITS | REPLACEMENT STORAGE ELEMENTS | |
|---|---|---|---|
| 114A<br>| 1 | 0 |<br>118A  118B | 112A<br>| 0 | 1 | 1 | 0 | | | X | X | X | X | | 104A |
| | X | X | | | X | X | X | | | X | X | X | X | | 104B |
| | X | X | | | X | X | X | | | X | X | X | X | | 104C |
| | X | X | | | X | X | X | | | X | X | X | X | | 104D |

FIG. 2

| ENABLE FUSES | | EFFECT |
| --- | --- | --- |
| 118A | 118B | |
| 0 | 0 | REPLACEMENT STORAGE ELEMENT DISABLED |
| 0 | 1 | REPLACEMENT STORAGE ELEMENT ENABLED |
| 1 | 0 | REPLACEMENT STORAGE ELEMENT ENABLED |
| 1 | 1 | REPLACEMENT STORAGE ELEMENT DISABLED |

MEMORY EMPLOYING MULTIPLE ENABLE/DISABLE MODES FOR REDUNDANT ELEMENTS AND TESTING METHOD USING SAME

BACKGROUND OF THE INVENTION

The present invention relates to a memory device having a plurality of storage elements and a plurality of replacement storage elements, each of which may be substituted for one of the storage elements.

In a memory circuit, e.g., a dynamic random access memory (DRAM) or a field programmable logic device, a plurality of memory cells are typically arranged in rows and columns for addressable access. For example, a DRAM chip may include 256 million cells (or more), which are arranged in an array of rows (activated by word lines) and columns (activated by bit lines).

In a conventional DRAM chip, one or more of the millions of cells of the memory array may be defective. In order to avoid the need to discard an entire DRAM chip, redundant cells are provided that may be substituted for the one or more defective cells. Usually, if a particular cell in the memory array is determined to be defective (e.g., during a manufacturing/test process), the entire row and/or column containing the defective cell is usually replaced by a redundant row and/or column. Herein, rows and/or columns of cells may be referred to as storage elements.

A conventional technique of substituting a defective storage element of the memory array with a replacement storage element involves using an enable fuse and address fuses associated with the replacement storage element. The address fuses contain the address of the defective storage element and the enable fuse indicates that the replacement of the defective storage element should be carried out. The enable fuse may take on an unfused state or may be permanently modified to take on a fused state. The enable fuse is modified (or set) to take on the fused state to indicate that the replacement storage element should replace the defective storage element of the memory array. The address of the defective storage element of the memory array is stored by setting certain of the address fuses associated with the replacement storage element. In use, when the defective storage element of the memory array is addressed, a comparison of the incoming address and the address stored in the address fuses will match. This indicates that the replacement storage element should be accessed instead of the defective storage element (so long as the enable fuse is set).

The conventional technique for replacing a defective storage element of the memory array with a replacement storage element does not permit the replacement to be reversed during the manufacture/testing process. This is so because once the enable fuse is set (fused) it cannot be unfused. Although the desirability of reversing the replacement process may appear counterintuitive, significant advantages in evaluating and performing manufacturing tests would be obtained if such reversal were possible.

In view of the foregoing, there is a need in the art for a new memory in which it is possible to replace certain storage elements of the memory array with other storage elements and, thereafter, to reverse such replacement and evaluate differences in the performance of the memory.

SUMMARY OF THE INVENTION

In accordance with at least one aspect of the present invention, a memory includes: a memory array having a plurality of storage elements; a plurality of replacement storage elements; a plurality of address storage units, each operable to store a replacement address associated with a respective one of the replacement storage elements; a plurality of enable storage units, each operable to store at least first and second enable bits associated with a respective one of the replacement storage elements; and a decode unit operable to (i) activate one of the replacement storage elements when the at least first and second enable bits associated therewith are in an enable state and an input address matches the replacement address associated with the replacement storage element, and (ii) deactivate the replacement storage element when the at least first and second enable bits associated therewith have changed to a disable state.

Preferably each of the plurality of enable storage units includes a first fusible link for storing the first enable bit and a second fusible link for storing the second enable bit. It is understood that each of the plurality of enable storage units may include one or more further fusible links for storing further enable bits. Each fusible link preferably has an unfused state that may be permanently modified to a fused state, and the first and second enable bits are in the enable state when either of the fist and second fusible links is in the fused state. The first and second enable bits are preferably in the disable state when both the first and second fusible links are in the fused state. The decode unit preferably does not activate one of the replacement storage elements when the first and second fusible links associated therewith are both in the unfused state.

The plurality of storage elements of the memory array preferably includes row storage elements and column storage elements and the plurality of replacement storage elements includes row replacement storage elements and column replacement storage elements. The plurality of address storage units preferably includes (i) row address storage units, each operable to store a row replacement address associated with a respective one of the row replacement storage elements, and (ii) column address storage units, each operable to store a column replacement address associated with a respective one of the column replacement storage elements. The plurality of enable storage units preferably includes (i) row enable storage units, each operable to store at least first and second enable bits associated with a respective one of the row replacement storage elements, and (ii) column enable storage units, each operable to store at least first and second enable bits associated with a respective one of the column replacement storage elements.

In accordance with at least one further aspect of the present invention, a method of testing one or more memories is contemplated, where each memory includes a memory array having a plurality of storage elements and a plurality of replacement storage elements, each of which may be substituted for one of the storage elements of the given memory array when enabled. The method includes: conducting a first test on the plurality of storage elements of one or more memory arrays; enabling a first set of the replacement storage elements to replace a corresponding first set of the storage elements of the one or more memory arrays in response to results of the first test; conducting a second test on the plurality of storage elements of the one or more memory arrays as replaced by the first set of replacement storage elements; enabling a second set of the replacement storage elements to replace a corresponding second set of the storage elements of the one or more memory arrays in response to results of the second test; conducting a third test on the plurality of storage elements of the one or more memory arrays as replaced by the first and second sets of replacement storage elements and determining a first yield based thereon; disabling one of the first and second sets of replacement storage elements; conducting the third test on the plurality of storage elements of the one or more memory arrays as replaced by the remaining one of the first and second sets of replacement storage elements and determining a second yield based thereon; and comparing the first and second yields to determine the efficacy of the first or second test.

The one or more memories preferably further include a plurality of enable storage units, each operable to store at least first and second enable bits associated with a respective one of the replacement storage elements. The step of enabling the first set of the replacement storage elements preferably includes setting the respective at least first and second enable bits associated therewith to an enable state, and the step of enabling the second set of the replacement storage elements preferably includes setting the respective at least first and second enable bits associated therewith to an enable state. The step of disabling one of the first and second sets of replacement storage elements preferably includes setting the respective at least first and second enable bits associated therewith from the enable state to a disable state.

Other aspects, features, advantages, etc. will be apparent to one skilled in the art when the disclosure herein is taken in conjunction with the accompanying drawings.

BRIEF DESCRIPTION OF THE DRAWINGS

For the purposes of illustrating the invention, there are shown in the drawings, forms that are presently preferred, it being understood, however, that the invention is not limited to the precise arrangements and instrumentalities shown.

DETAILED DESCRIPTION

Figure 1:
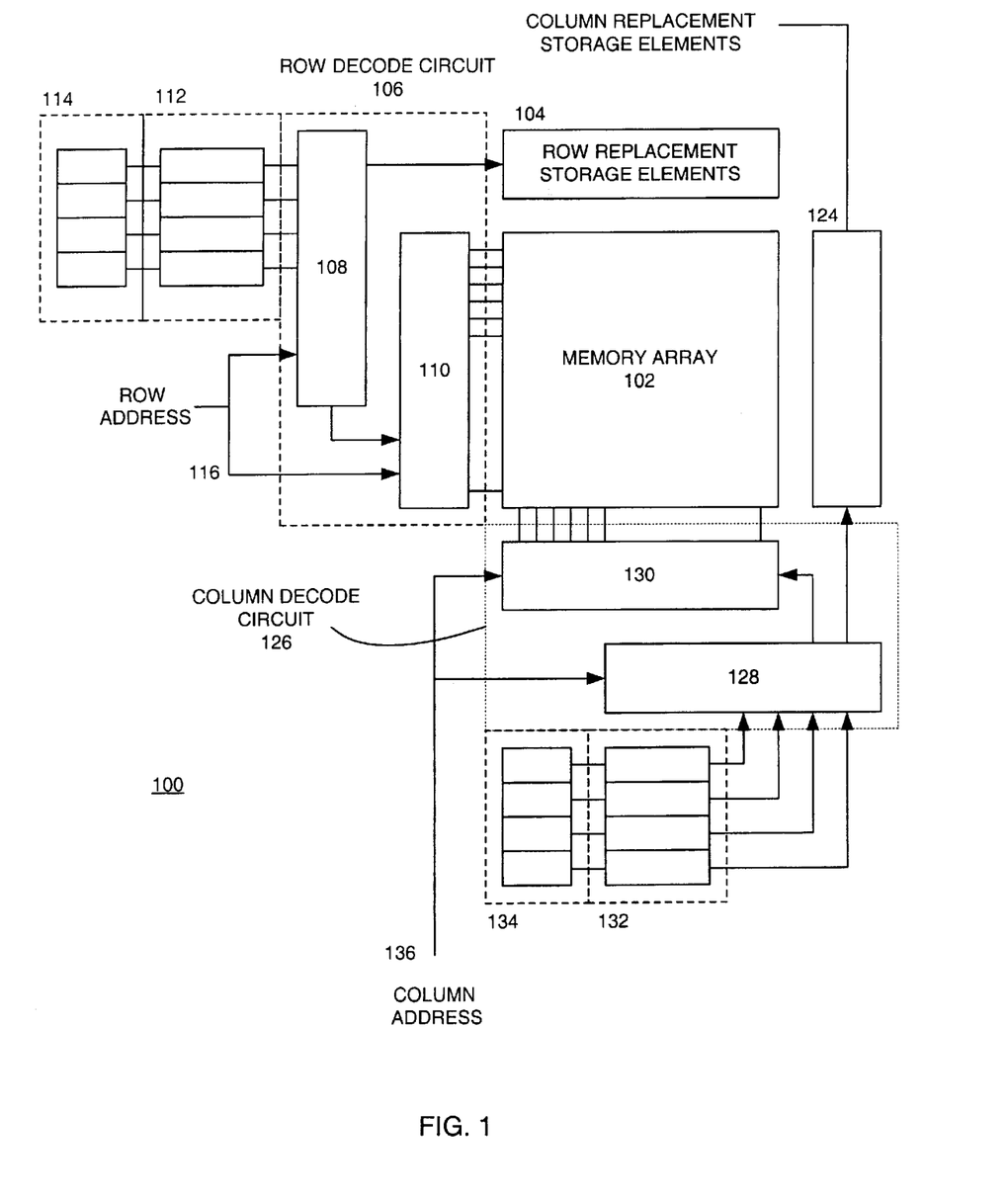
FIG. 1 is a block diagram of a memory in accordance with one or more aspects of the present inventions.

Referring now to the drawings, wherein like numerals indicate like elements, there is shown in FIG. 1 a memory 100 in accordance with one or more aspects of the present invention. The memory 100 preferably includes a memory array 102 having a plurality of storage elements, such as N storage elements, each containing for example M storage cells (where N and M are any integers). Referring to portions of the memory 100 associated with row elements of the memory array 102, the memory 100 further includes a plurality of row replacement storage elements 104 and a row decode circuit 106. The row decode circuit 106 includes a row compare circuit 108 and an array row decode circuit 110. The memory 100 preferably further includes a plurality of row address storage units 112 and a plurality of row enable storage units 114.

Referring now to portions of the memory 100 associated with columns of the memory array 102, the memory 100 preferably includes a plurality of column replacement storage elements 124 and a column decode circuit 126. The column decode circuit 126 includes a column compare circuit 128 and an array column decode circuit 130. The memory 100 preferably further includes a plurality of column address storage units 132 and a plurality of column enable storage units 134.

For purposes of simplicity, a detailed discussion of the components associated with the row elements of the memory 100 will now be made, it being understood, however, that this discussion may be readily applied to the components associated with the columns of the memory array 102. The row decode circuit 106 is preferably operable to activate one of the row storage elements of the memory array 102 or one of the row replacement storage elements 104 in response to a row address input at 116. The row decode circuit 106 preferably activates a row storage element of the memory array 102 when the row address input at 116 does not identify a row storage element of the memory array 102 that is to be replaced (e.g., a defective row storage element). On the other hand, the row decode circuit 106 preferably activates a row replacement storage element 104 when the row address input at 116 addresses a defective row storage element of the memory array 102 that is to be replaced.

The above functionality is achieved by coupling the row address at 116 to the row compare circuit 108 and the array row decode circuit 110, coupling the row compare circuit 108 to the row replacement storage elements 104, and coupling the array row decode circuit 110 to the memory array 102 (e.g., to the word lines thereof). Addresses of any row storage elements of the memory array 102 that are to be replaced (e.g., because they are defective) are preferably stored in respective ones of the row address storage units 112. These addresses (or replacement addresses) are preferably available to the row compare circuit 108 by coupling the row address storage units 112 to the row compare circuit 108. The row enable storage units 114 are also coupled to the row compare circuit 108. It is again noted that the above discussion may be readily applied to the portions of the memory 100 associated with column storage elements of the memory array 102.

In use, a row address input at 116 is received by the row compare circuit 108 and compared against the replacement addresses stored in the row address storage units 112. If there is no match between the row address input at 116 and any of the stored replacement addresses, then the row compare circuit 108 indicates such to the array row decode circuit 110. In response, the array row decode circuit 110 decodes the row address input at 116 to one of the row storage elements of the memory array 102 and permits access thereto. If, however, a match is obtained between the row address input at 116 and one of the stored replacement addresses, then access to the addressed row storage element of the memory array 102 will not be permitted if replacement thereof has been enabled. In particular, the row compare circuit 108 permits access to one of the row replacement storage elements 104 associated with the row address storage unit 112 containing the matched replacement address provided that a row enable storage unit 114 associated with that row replacement storage element 104 is in an enabled state. It is again noted that the above discussion may be readily applied to the portions of the memory 100 associated with column storage elements of the memory array 102.

Figure 2:
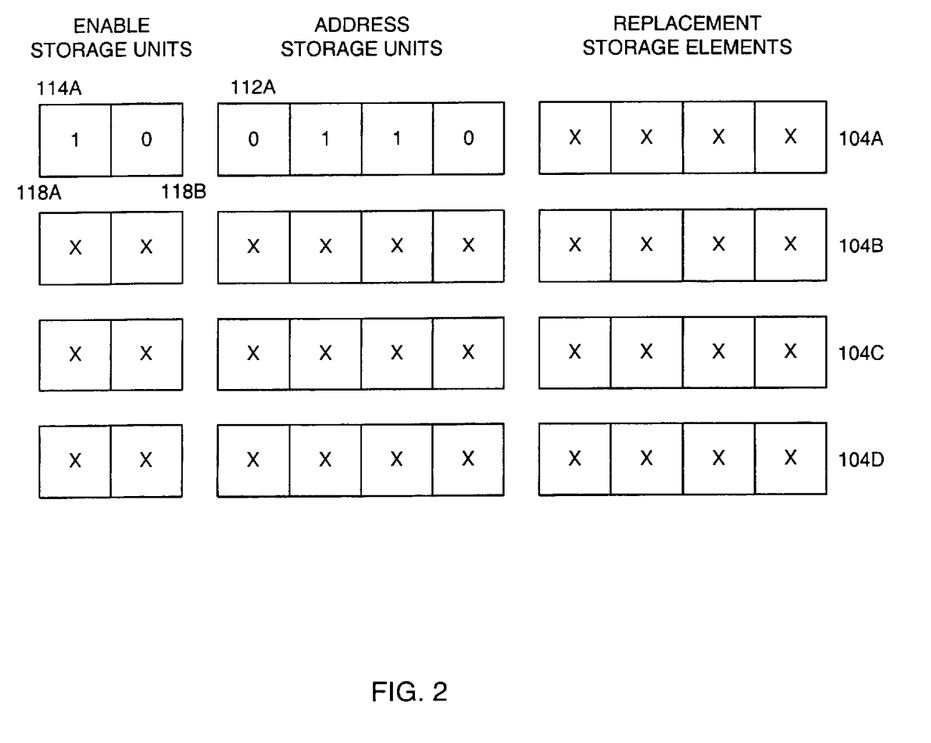
FIG. 2 is a schematic drawing illustrating certain aspects of the memory of FIG. 1.

Reference is now made to FIG. 2, which is a schematic illustration showing the cooperation between the row enable storage units 114, the row address storage units 112, and the row replacement storage elements 104. For the purposes of discussion, the row replacement storage elements 104 include four replacement elements 104A–D. One enable storage unit 114 and one row address storage unit 112 is associated with each of the row replacement storage elements 104. Each of the row enable storage units 114 is preferably operable to store at least first and second enable bits associated with a respective one of the row replacement storage elements 104. For example, row enable storage unit 114A is preferably operable to store a first enable bit 118A and a second enabled bit 118B. It is again noted that the above discussion may be readily applied to the portions of the memory 100 associated with column storage elements of the memory array 102.

When the first and second enable bits of a given row enable storage unit 114 (such as row enable storage unit 114A) are in an enable state (such as 1,0) and a match exists between the replacement address stored in the associated row address storage unit 112 (such as replacement address 0110 of row address storage unit 112A), then the row decode circuit 106 is preferably operable to activate the associated row replacement storage element 104 (such as row replacement storage element 104A). In addition, the row decode circuit 106 is preferably further operable to deactivate that replacement storage element (i.e., row replacement storage element 104A) when the first and second enable bits 118A, 118B contained in the associated row enable storage unit 114A have changed to a disable state (e.g. 1,1). It is again noted that the above discussion may be readily applied to the portions of the memory 100 associated with column storage elements of the memory array 102.

Each of the row enable storage units 114 preferably includes a first fusible link for storing the first enable bit and a second fusible link for storing the second enable bit. It is understood, however, that one or more further fusible links may be employed for storing one or more further enable bits without departing from the spirit and scope of the invention. Each of the fusible links preferably has an unfused state that may be permanently modified to a fused state. In accordance with the invention, the fact that the fusible links may be permanently modified to the fused state does not prevent a reversal in the replacement of a row storage element of the memory array 102 by one of the row replacement storage elements 104. In other words, once the first and second enable bits (e.g., bits 118A and 118B) indicate an enable state and a row storage element of the memory array 102 has been replaced by the row replacement storage element 104A, such replacement is not permanent and may be reversed. It is again noted that the above discussion may be readily applied to the portions of the memory 100 associated with column storage elements of the memory array 102.

Figure 3:
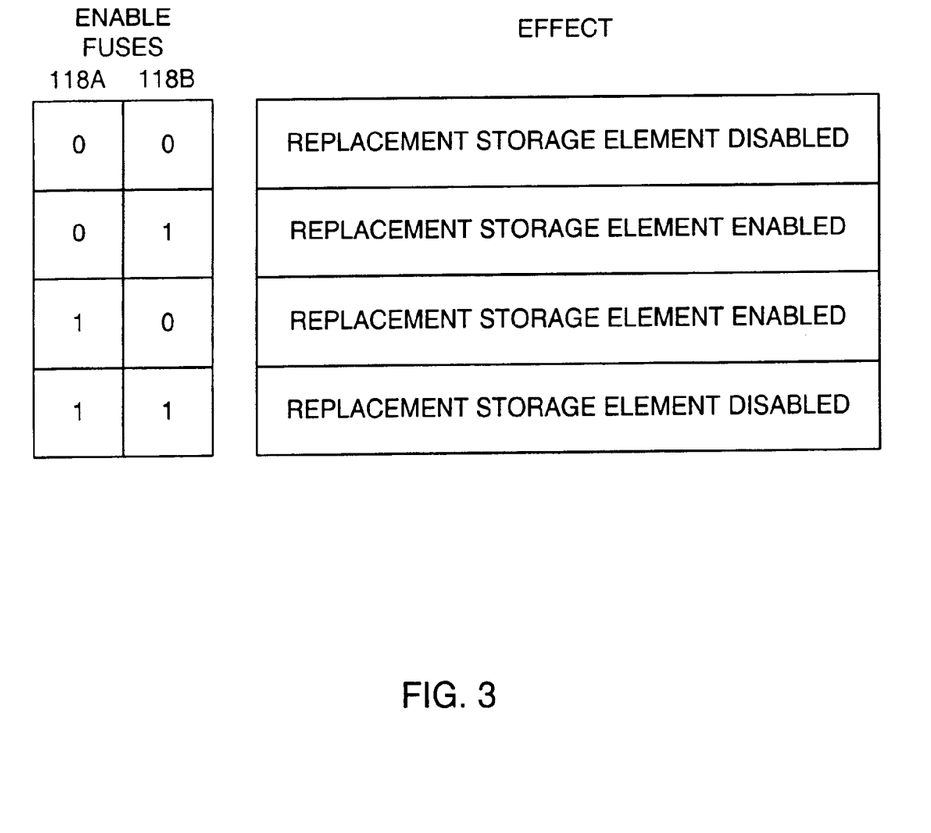
FIG. 3 is a truth table illustrating certain aspects of the memory of FIG. 1.

The above functionality will now be further described with reference to FIG. 3, which is an illustrative truth table as to the effect of the first and second enable bits (e.g., bits 118A and 118B) of a given row enable storage unit 114. It is understood, however, that the truth table may apply to any of the row enable storage units in accordance with the present invention. For the purposes of illustration, a zero ("0") preferably represents a fusible link in an unfused state and the number one ("1") represents a fuseable link in the permanent, fused state. In accordance with the invention, the first and second enable bits are in a disable state when both bits are in the unfused state (i.e., 0,0). Thus, for example, when the fusible links of a given row enable storage unit 114 have not been modified in any way and are in the unfused state, the row decode circuit 106 will not replace any of the row storage elements of the memory array 102 with the row replacement element 104 associated with that row enable storage unit 114. If, however, one of the first and second enable bits (e.g., 118A or 118B) are in the fused state (i.e., 0,1 or 1,0), then the row decode circuit 106 is preferably operable to replace a row storage element of the memory array 102 (having an address that matches the replacement address stored in the associated row address storage unit 112) by the row replacement element 104 associated with that row enable storage unit 114. Further, assuming that one of the first and second enabled bits were permanently modified to the fused state (and therefore enabled the associated row replacement storage element 104), such replacement may be reversed by modifying the other of the first and second enabled bits to the fused state (i.e., 1,1). Advantageously, this permits reversal of a previously defined replacement, a very useful result as will be discussed below. It is again noted that the above discussion may be readily applied to the portions of the memory 100 associated with column storage elements of the memory array 102.

Figure 4A:
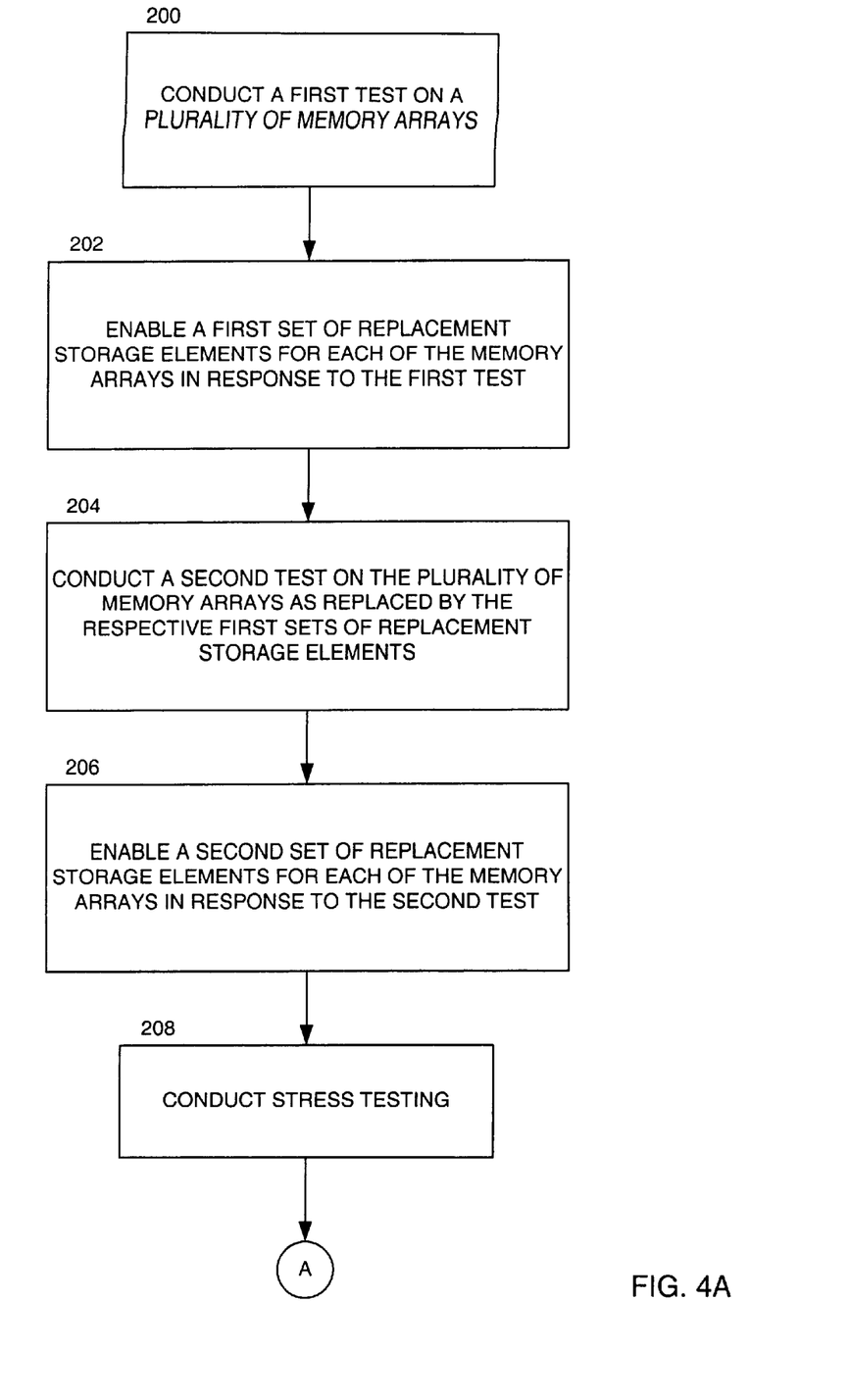
FIGS. 4A and 4B are flow diagrams illustrating one or more aspects of a method in accordance with the present invention.

Reference is now made to FIG. 4A, which is a flow diagram illustrating one or more aspects of a method that may be carried out in accordance with the present invention. In general, the flow diagram is illustrative of a method of testing one or more memories, such as those memories having the functionality of the memory 100 illustrated in FIG. 1. At action 200, a first test is preferably conducted on the storage elements of the memory arrays 102 of the one or more memories. By way of example, the first test may be a so-called front end test, such as a prefuse test. One such test could be a memory cell retention time test, where one or more of the storage elements of the memory array 102 are written to using known data and, thereafter, the contents of the storage elements are read to determine whether the data retrieved matches the known data. The delay between writing and reading the data to/from the storage elements of the memory array 102 may be tightly controlled to determine whether certain retention time specifications can be met (e.g., 128 ms, 256 ms, 320 ms, etc.).

At action 202, a first set of the replacement storage elements 104 are preferably enabled to replace a corresponding first set of the storage elements of the memory arrays 102 in response to results of the first test. For example, assuming that a first set of the storage elements of one or more memory arrays 102 failed to meet the retention time specification of the first test, then a first set of the replacement storage elements are preferably enabled to replace the subject storage elements of that memory array 102. with reference to FIGS. 2 and 3, enabling the first set of replacement storage elements preferably involves setting one of the first and second enable bits of a corresponding set of row enable storage units 114 (and/or column enable storage units 134) and storing the addresses of the first set of storage elements of the memory array 102 (i.e., the storage elements to be replaced) in the corresponding row address fuses 112 (and/or column address fuses 132). It is most preferred that the row enable storage units 114 (and/or column enable storage units 134) associated with the first set of replacement storage elements 104 all have the same enable bit set (e.g., all of the enable storage units contain fusible links in the 1,0 configuration).

At action 204 a second test is preferably conducted on the plurality of storage elements of the memory arrays 102 as replaced by the first set of replacement storage elements. The second test may be, for example, another retention time test, or may be any other suitable test. At action 206, a second set of replacement storage elements 104 are preferably enabled to replace a corresponding second set of the storage elements of the memory arrays 102 in response to results of the second test. By way of example, the second test may be a more stringent retention time test (e.g., requiring a longer delay between writing and reading data from the storage elements of the memory array 102) and, therefore, another set of storage elements may fail to meet the specifications of the test in a given memory array 102. To that end, the row enable storage units 114 (and/or column enable storage units 134) associated with the second set of replacement storage elements 104 is preferably placed in an enable state. With reference to FIGS. 2 and 3, one of the fusible links of the row enable storage units 114 (and/or column enable storage units 134) associated with the second set of replacement storage elements 104 is preferably set while the other is not. It is most preferred that an opposite one of the first and second fusible links is set as compared with the row enable storage units 114 (and/or column enable storage units 134) associated with the first set of replacement storage elements.

For example, if the fusible links of the row enable storage units 114 (and/or column enable storage units 134) associated with the first set of replacement storage elements 104 where placed into the enable state by setting the first enable bit (i.e., 1,0), then the row enable storage units 114 (and/or column enable storage units 134) associated with the second set of replacement storage elements 104 are preferably placed into the enable state by setting the opposite enable bit (i.e., 0,1). As will be discussed below, this results in the advantageous ability to identify and reverse the first and/or second sets of replacement storage elements 104.

At action 208, a post fuse test is preferably conducted on the plurality of storage elements of the memory arrays 102. For example, environmental stress tests and/or other post fuse tests may be carried out.

Figure 4B:
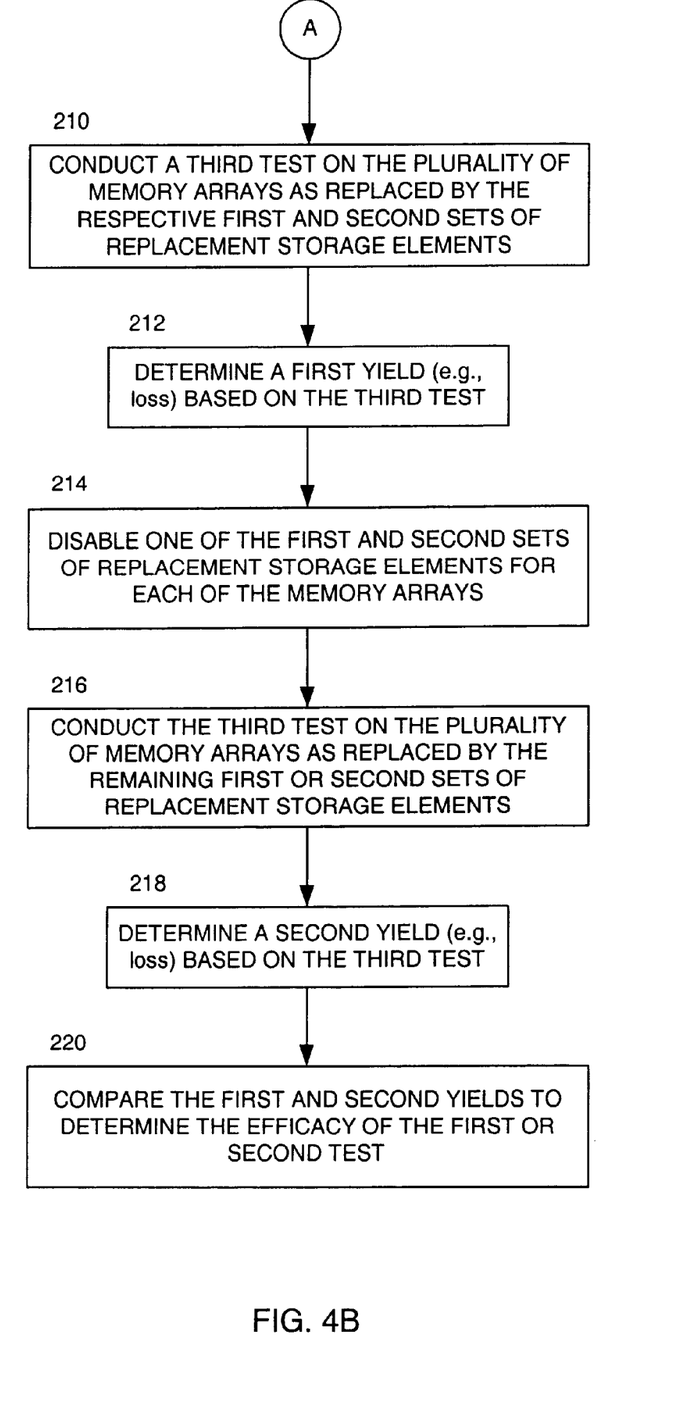

Turning to FIG. 4B, at action 210, a third test is preferably conducted on the plurality of storage elements of the memory arrays 102. For example, the third test may be, another retention time test to determine whether the storage elements of the memory arrays 102 (including the first and second sets of replacement storage elements) meet a specified retention time. A first yield is preferably determined after the third test is conducted (action 212). For example, a ratio of a number of memory arrays 102 passing the third test to a total number of the memories or a ratio of a number of memories failing the third test to the total number of memories may define the first yield.

At action 214, one of the first and second sets of replacement storage elements is preferably disabled in the memories. With reference to FIGS. 2 and 3, this is preferably achieved by setting the enable bits of the row enable storage units 114 (and/or column enable storage units 134) associated with the one of the first and second sets of replacement storage elements 104 that were not previously set. For example, assuming that the second set of replacement storage elements 104 is to be disabled and the second set of replacement storage elements 104 was first enabled by setting the second enable bit of the row and/or column enable storage units 114, 134 (i.e., the fusible links were placed in the 0,1 state), then to disable the second set of replacement storage elements 104 at action 214, it is preferred that the first enable bit of those row and/or column enable storage units 114, 134 is set (i.e., such that the fusible links are placed in the 1,1 state).

At action 216, the third test is preferably again carried out on the storage elements of the memory arrays 102 (including the remaining one of the first and second sets of replacement storage elements 104). A second yield is preferably determined (action 218), for example, using an algorithm similar to that of the first yield. At action 220, the first and second yields are preferably compared to determine the efficacy of the first or second test. For example, the comparison may reveal that, for example, the second test has a high or low effect on the yield after performing environmental stress tests (this is sometimes referred to as the "gain" associated with the second test).

The above method may be applied to split lot results, where a plurality of memories are divided (e.g., in half) into split lots. One lot has a natural yield difference between arbitrarily chosen groups. This preferably applies to a prefuse test (e.g., the first and/or second test) where a number of additional storage element replacements can be determined and the back end test coverage can be calculated. Advantageously, no quality downgrade of splits occurs where tests have to be omitted. This is particularly advantageous for technology development, where the spread, standard deviation, and instability of the manufacturing processes increases. Cost efficiencies may be obtained by reducing the downgrading of hardware (i.e., memories) in split lots and increasing the speed and accuracy of test results.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A memory, comprising:
   a memory array having a plurality of storage elements;
   a plurality of replacement storage elements;
   a plurality of address storage units, each operable to store a replacement address associated with a respective one of the replacement storage elements;
   a plurality of enable storage units, each operable to store at least first and second enable bits associated with a respective one of the replacement storage elements; and
   a decode unit operable to (i) activate one of the replacement storage elements when the at least first and second enable bits associated therewith are in an enable state and an input address matches the replacement address associated with the replacement storage element, and (ii) deactivate the replacement storage element when the at least first and second enable bits associated therewith have changed to a disable state.

2. The memory of claim 1, wherein each of the plurality of enable storage units includes a first fusible link for storing the first enable bit and a second fusible link for storing the second enable bit.

3. The memory of claim 2, wherein each of the plurality of enable storage units includes a further fusible link for storing a further enable bit.

4. The memory of claim 2, wherein each fusible link has an unfused state that may be permanently modified to a fused state, and the first and second enable bits are in the enable state when either of the first and second fusible link is in the fused state.

5. The memory of claim 4, wherein the first and second enable bits are in the disable state when both the first and second fusible links are in the fused state.

6. The memory of claim 5, wherein the decode unit does not activate one of the replacement storage elements when the first and second fusible links associated therewith are both in the unfused state.

7. The memory of claim 2, wherein each of the plurality of address storage units includes a plurality of fusible links for storing one of the replacement addresses.

8. The memory of claim 1, wherein the plurality of storage elements of the memory array includes row storage elements and column storage elements.

9. The memory of claim 8, wherein the plurality of replacement storage elements includes row replacement storage elements and column replacement storage elements.

10. The memory of claim 9, wherein the plurality of address storage units includes (i) row address storage units, each operable to store a row replacement address associated with a respective one of the row replacement storage elements, and (ii) column address storage units, each operable to store a column replacement address associated with a respective one of the column replacement storage elements.

11. The memory of claim 10, wherein the plurality of enable storage units includes (i) row enable storage units, each operable to store at least first and second enable bits associated with a respective one of the row replacement storage elements, and (ii) column enable storage units, each operable to store at least first and second enable bits associated with a respective one of the column replacement storage elements.

12. The memory of claim 11, wherein the input address includes at least one of a row input address and a column input address.

* * * * *